United States Patent [19]
Brady

[11] Patent Number: 6,111,801
[45] Date of Patent: Aug. 29, 2000

[54] TECHNIQUE FOR TESTING WORDLINE AND RELATED CIRCUITRY OF A MEMORY ARRAY

[75] Inventor: James Brady, Plano, Tex.

[73] Assignee: STMicroelectronics, Inc., Carrollton, Tex.

[21] Appl. No.: 09/302,598

[22] Filed: Apr. 30, 1999

[51] Int. Cl.[7] .................................................. G11C 29/00
[52] U.S. Cl. ........................ 365/201; 365/200; 371/25.1; 371/21.1
[58] Field of Search .................................. 365/201, 200; 371/25.1, 21.1

[56] References Cited

U.S. PATENT DOCUMENTS

| | | | |
|---|---|---|---|
| 5,553,082 | 9/1996 | Connor et al. | 371/25.1 |
| 5,936,900 | 8/1999 | Kii et al. | 365/201 |
| 5,995,429 | 11/1999 | Kojima et al. | 365/201 |
| 6,002,623 | 12/1999 | Stave et al. | 365/201 |

Primary Examiner—David Nelms
Assistant Examiner—Connie C. Yoha
Attorney, Agent, or Firm—Theodore E. Galanthay; Lisa K. Jorgenson; Andre Szuwalski

[57] ABSTRACT

A technique for testing wordline and related circuitry of a memory array is disclosed. The memory array includes a plurality of memory cells arranged in a plurality of rows, wherein each of the plurality of rows has a respective wordline connected to respective ones of the plurality of memory cells. The related circuitry includes a decode circuit connected to each of the respective wordlines for activating at least one of the respective wordlines based upon a corresponding address signal that is decoded by the decode circuit. The technique involves applying an address signal to the decode circuit so as to activate a corresponding one of the respective wordlines, and then monitoring the corresponding one of the respective wordlines so as to determine if the corresponding one of the respective wordlines has been activated and thereby determine if the memory array and related circuitry are operating in a proper manner.

18 Claims, 9 Drawing Sheets

TECHNIQUE FOR TESTING WORDLINE AND RELATED CIRCUITRY OF A MEMORY ARRAY

FIELD OF THE INVENTION

The present invention relates generally to memory devices and, more particularly, to a technique for testing wordline and related circuitry of a memory array.

BACKGROUND OF THE INVENTION

The complexity of computer systems has increased exponentially over the last few decades. Along with this exponential increase in computer system complexity, there has been a corresponding exponential increase in the complexity of storage (i.e., memory) devices, which are typically required to facilitate the operation of these computer systems. Due to this increase in memory device complexity, it has become increasingly difficult to test the internal circuitry of memory devices. For example, in the case of random access memory (RAM), the traditional method of testing involves writing predetermined patterns of 1's and 0's into memory cells of a RAM device and then reading from these same memory cells so as to verify that the RAM device, and, in particular, the memory cells, operate in a proper manner. However, this method is inadequate for detecting faults in the complex row and column circuitry that is included in virtually all RAM devices. For example, if a short or an open circuit occurs in the row or column decode circuitry of a RAM device, only half of the memory may be addressed and the RAM device could still pass a test based on the above-described traditional method of testing by reading back the same pattern that was written into memory cells of the RAM device that were actually addressed.

One solution for overcoming the above-described inadequacies associated with the above-described traditional method of testing is to write diagonal patterns of 1's and 0's into memory cells of a RAM device so as to guarantee that every row of the RAM device is working. Additional diagonal patterns of 1's and 0's must also be written into memory cells of the RAM device so as to guarantee that every column of the RAM device is working. As can be easily understood, this testing method requires a significant memory requirement to store the diagonal test patterns and a lengthy computation time to perform the test, both of which can result in increased cost and complexity.

Another testing problem has arisen due to the increase in memory device complexity. That is, the increased complexity of memory devices has perhaps been most noted in the area of increased density, which has allowed memory devices to essentially be included, or embedded, along with other types of circuitry in integrated circuit devices. Because an embedded memory is typically not directly accessible from the external input/output (I/O) pins of an integrated circuit device, it is difficult to fully test the embedded memory.

One solution for testing an embedded memory, as well as other types of embedded circuitry, is to employ built-in-self-test (BIST) circuitry in an integrated circuit device along with the embedded memory and the other types of embedded circuitry. BIST circuitry is essentially control circuitry which, when activated, tests embedded memory and other types of embedded circuitry within an integrated circuit device. For example, in the case of an embedded RAM, BIST circuitry can test the embedded RAM using one of the above-described testing methods. However, the BIST circuitry is faced with the same inadequacies and shortcomings in these testing methods as have been described above. That is, the inadequacies associated with the above-described traditional testing method and the increased cost and complexity associated with the above-described diagonal pattern testing method will also be encountered by the BIST circuitry.

In view of the foregoing, it would be desirable to provide a technique for testing memory which overcomes the above-described inadequacies and shortcomings. More particularly, it would be desirable to provide a technique for testing a memory array and related circuitry in an efficient and cost effective manner.

SUMMARY OF THE INVENTION

According to the present invention, a technique for testing wordline and related circuitry of a memory array is provided. The memory array includes a plurality of memory cells arranged in a plurality of rows, wherein each of the plurality of rows has a respective wordline connected to respective ones of the plurality of memory cells. The related circuitry includes a decode circuit connected to each of the respective wordlines for activating at least one of the respective wordlines based upon a corresponding address signal that is decoded by the decode circuit. Such an arrangement is typical for most memory circuits wherein each of the respective wordlines is activated so as to enable access to the respective ones of the plurality of memory cells.

The technique is realized by applying an address signal to the decode circuit so as to activate a corresponding one of the respective wordlines, and then monitoring the corresponding one of the respective wordlines so as to determine if the corresponding one of the respective wordlines has been activated and thereby determine if the memory array and related circuitry are operating in a proper manner.

In accordance with other aspects of the present invention, the address signal for the decode circuit can be generated by a control circuit such as, for example, a BIST control circuit. The address signal is preferably latched in the decode circuit by a latch circuit. The latched address signal is then preferably decoded in the decode circuit so as to activate the corresponding one of the respective wordlines.

In accordance with further aspects of the present invention, a detector circuit can be used to detect if the corresponding one of the respective wordlines has been activated. A deactivator circuit can then be used to deactivate the corresponding one of the respective wordlines after it has been detected. A latch circuit can then be used to prevent the detection of a subsequent activation of the corresponding one of the respective wordlines after it has been deactivated.

In accordance with still further aspects of the present invention, a sequence of address signals can be applied to the decode circuit so as to activate a corresponding sequence of the respective wordlines. Similar to the above, this sequence of address signals can be generated for the decode circuit also by a control circuit such as, for example, a BIST control circuit. Each address signal in the sequence of address signals is preferably latched in the decode circuit by a latch circuit. Each latched address signal in the sequence of latched address signals is then preferably decoded in the decode circuit so as to activate the corresponding sequence of the respective wordlines. Each respective wordline in the corresponding sequence of the respective wordlines is preferably monitored so as to determine if each respective wordline in the corresponding sequence of the respective wordlines has been activated and thereby determine if the memory array and related circuitry are operating in a proper manner.

In accordance with still further aspects of the present invention, a detector circuit can be used to detect if each respective wordline in the corresponding sequence of the respective wordlines has been activated. A deactivator circuit can then be used to deactivate each respective wordline in the corresponding sequence of the respective wordlines after they have been detected. A latch circuit can then be used to prevent the detection of a subsequent activation of any of the respective wordlines in the corresponding sequence of the respective wordlines after they have been deactivated.

BRIEF DESCRIPTION OF THE DRAWINGS

In order to facilitate a fuller understanding of the present invention, reference is now made to the appended drawings. These drawings should not be construed as limiting the present invention, but are intended to be exemplary only.

DETAILED DESCRIPTION OF A PREFERRED EMBODIMENT

Figure 1:
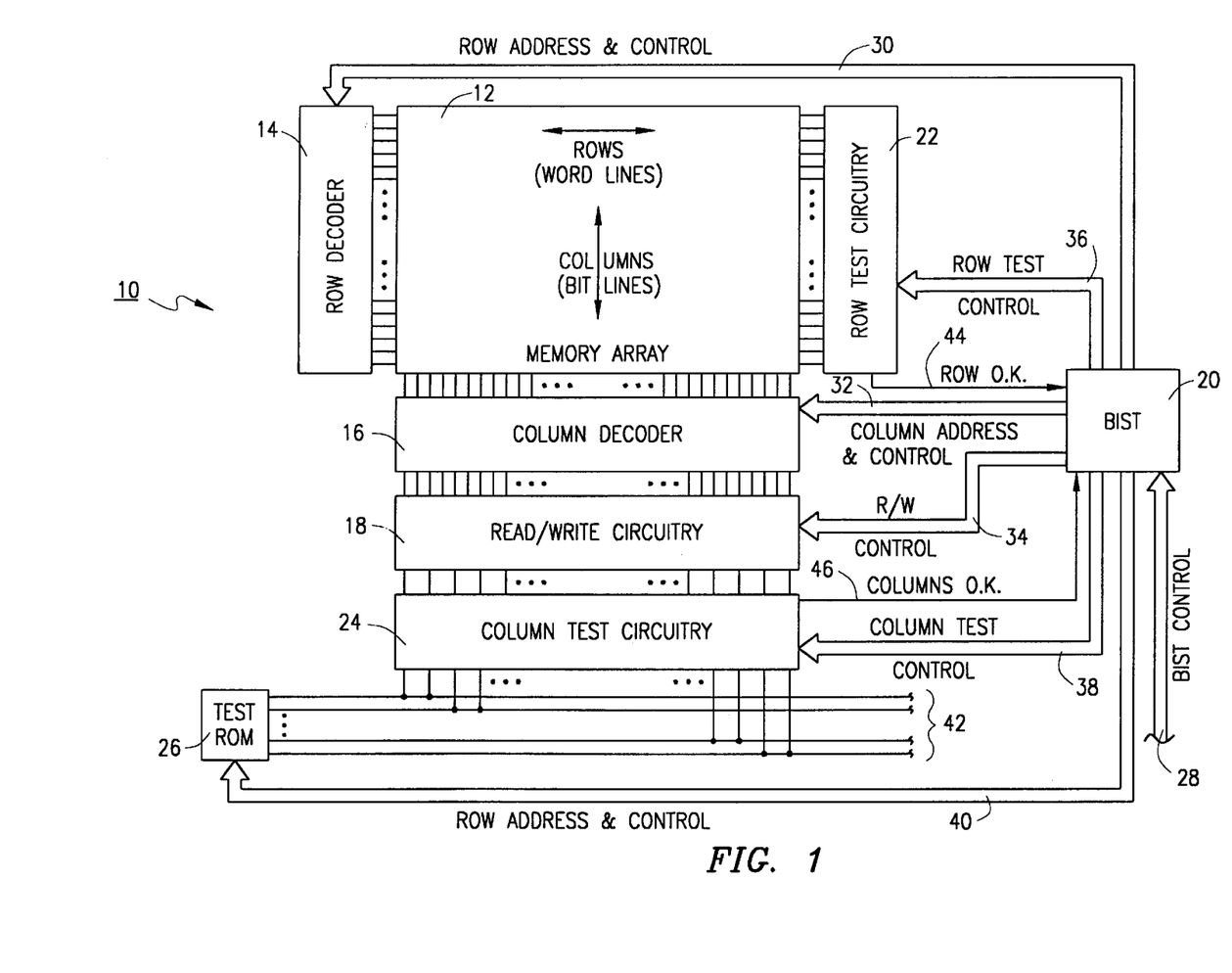
FIG. 1 is a schematic diagram of a memory circuit having built-in-self-test (BIST) capabilities in accordance with the present invention.

Referring to FIG. 1, there is shown a schematic diagram of a memory circuit 10 having built-in-self-test (BIST) capabilities in accordance with the present invention. The memory circuit 10 includes a memory array 12, a row address decoder 14, a column address decoder 16, read/write (R/W) circuitry 18, a BIST controller 20, row test circuitry 22, column test circuitry 24, and a test read-only-memory (ROM) 26. Each of these components will be described in detail below.

The memory circuit 10 also includes BIST control lines 28 for carrying PIST control signals to the BIST controller 20. Row address and control lines 30 are also provided for carrying row address and control signals from the BIST controller 20 to the row address decoder 14. Similarly, column address and control lines 32 are provided for carrying column address and control signals from the BIST controller 20 to the column address decoder 16. Still further, R/W control lines 34 are provided for carrying R/W control signals from the BIST controller 20 to the R/W circuitry 18. The memory circuit 10 also includes row test control lines 36 for carrying row test control signals from the BIST controller 20 to the row test circuitry 22. Column test control lines 38 are also provided for carrying column test control signals from the BIST controller 20 to the column test circuitry 24, ROM address and control lines 40 for carrying ROM address and control signals from the BIST controller 20 to the test ROM 26, and a system data bus 42 for carrying data signals from the test ROM 26 to the memory array 12 through the column test circuitry 24, the R/W circuitry 18, and the column decoder 16.

It should be noted that the row address and control lines 30 are also typically utilized to carry row address and control signals to the row address decoder 14 from other circuitry such as, for example, an address buffer circuit (not shown) when the memory array 12 is being accessed during normal operation (i.e., not during test mode). It should also be noted that the column address and control lines 32 are also typically utilized to carry column address and control signals to the column address decoder 16 from other circuitry such as, for example, an address buffer circuit (not shown) when the memory array 12 is being accessed during normal operation (i.e., not during test mode). It should further be noted that the R/W control lines 34 are also typically utilized to carry R/W control signals to the R/W circuitry 18 from other circuitry such as, for example, a memory control logic circuit (not shown) when the memory array 12 is being accessed during normal operation (i.e., not during test mode). It should still further be noted that the system data bus 42 is also typically utilized to carry data signals between the memory array 12 and other circuitry such as, for example, a data buffer circuit (not shown) when the memory array 12 is being accessed during normal operation (i.e., not during test mode).

The memory circuit 10 further includes a row o.k. signal line 44 for carrying a row o.k. signal from the row test circuitry 22 to the BIST controller 20, and a columns o.k. signal line 46 for carrying a columns o.k. signal from the column test circuitry 24 to the BIST controller 20. Both of these signals will be described in detail below.

For purposes of this detailed description, the memory array 12 is described as being a dynamic random access memory (DRAM) array, although the present invention can be utilized for other types of memory or logic arrays such as, for example, a static random access memory (SRAM) array or a programmable read only memory (PROM) array.

Figure 2:
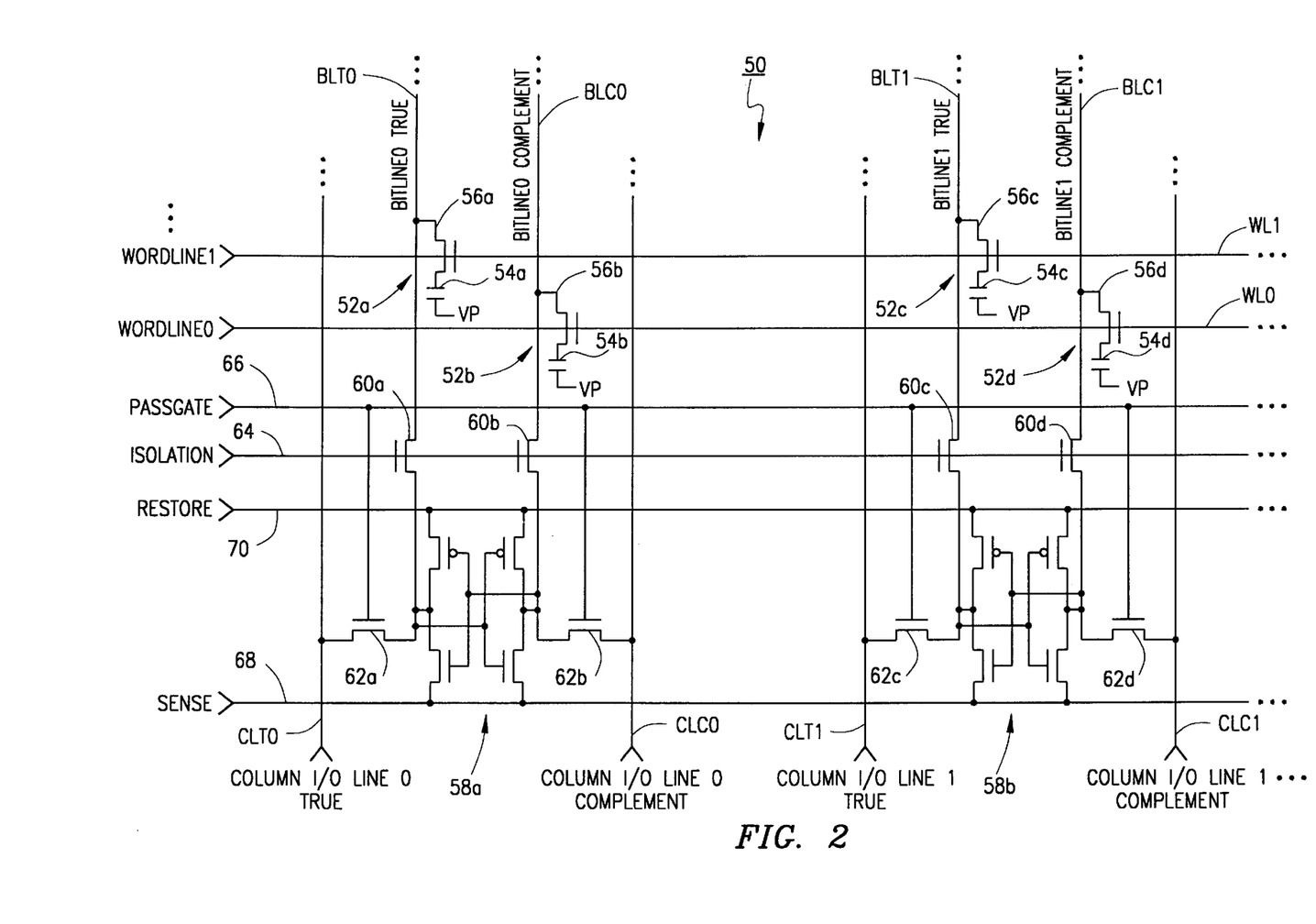
FIG. 2 is a detailed schematic diagram of a section of the DRAM memory array shown in FIG. 1.

Referring to FIG. 2, there is shown a detailed schematic diagram of a section 50 of the DRAM memory array 12. The section 50 of the DRAM memory array 12 includes a plurality of memory cells 52, each having a plate capacitor 54 and an access transistor 56. Each plate capacitor 54 has a first node that is connected to a plate voltage (Vp), which is typically maintained at a voltage level of VDD/2. Each access transistor 56 has a drain that is connected to a second node of an associated plate capacitor 54, a gate that is connected to a wordline (WL) of the DRAM memory array 12, and a source that is connected to either a true or complement bitline (BLT or BLC, respectively) of the DRAM memory array 12. In the section 50 of the DRAM memory array 12 that is shown, a pair of memory cells (i.e., 52a and 52b, 52c and 52d) share a sense amplifier circuit 58. Each sense amplifier circuit 58 is isolated from corresponding true and complement bitlines (BLT and BLC) of the DRAM memory array 12 by a pair of isolation transistors 60, which are controlled via an isolation signal that is carried over an isolation signal line 64. The isolation signal line 64 is connected to the gate of each isolation transistor 60. Each sense amplifier circuit 58 is also isolated from corresponding true and complement column input/output (I/O) lines (CLT and CLC, respectively) of the DRAM memory array 12 by a pair of passgate transistors 62, which are controlled via a passgate signal that is carried over a passgate signal line 66.

The passgate signal line 66 is connected to the gate of each passgate transistor 62. Each sense amplifier circuit 58 is controlled by sense and restore signals that are carried over sense and restore signal lines 68 and 70, respectively. The sense and restore signal lines 68 and 70 are connected to lower and upper rails, respectively, of each sense amplifier circuit 58. It should be noted that the isolation signal, the passgate signal, the sense signal, and the restore signal are typically generated internal to the DRAM memory array 12, but are typically controlled by the row address and control signals, the column address and control signals, and the R/W control signals, as described in detail below. The section 50 of the DRAM memory array 12 is typical of most DRAM memory arrays, and is included herein to provide a setting for describing the operation of the present invention testing technique.

Referring again to FIG. 1, the BIST controller 20 receives BIST control signals via the BIST control lines 28. The BIST control signals typically cause the BIST controller 20 to enter a test mode and thereafter assist the BIST controller 20 in controlling the testing of the DRAM memory array 12 and related circuitry. The BIST control signals typically include signals that are generated from circuitry (not shown) that is associated with the memory circuit 10 (e.g., a memory control logic circuit). However, the BIST control signals also typically include at least one signal that is generated from a source external to the memory circuit 10 and the circuitry (not shown) that is associated with the memory circuit 10 (e.g., a memory control logic circuit). For example, if the memory circuit 10 is part of an integrated circuit, a test mode enable signal is typically applied to an electrically conductive lead or pad on a package of the integrated circuit and then forwarded via the BIST control lines 28 to the BIST controller 20. Such a test mode enable signal typically places the BIST controller 20 into the test mode.

Figure 3:
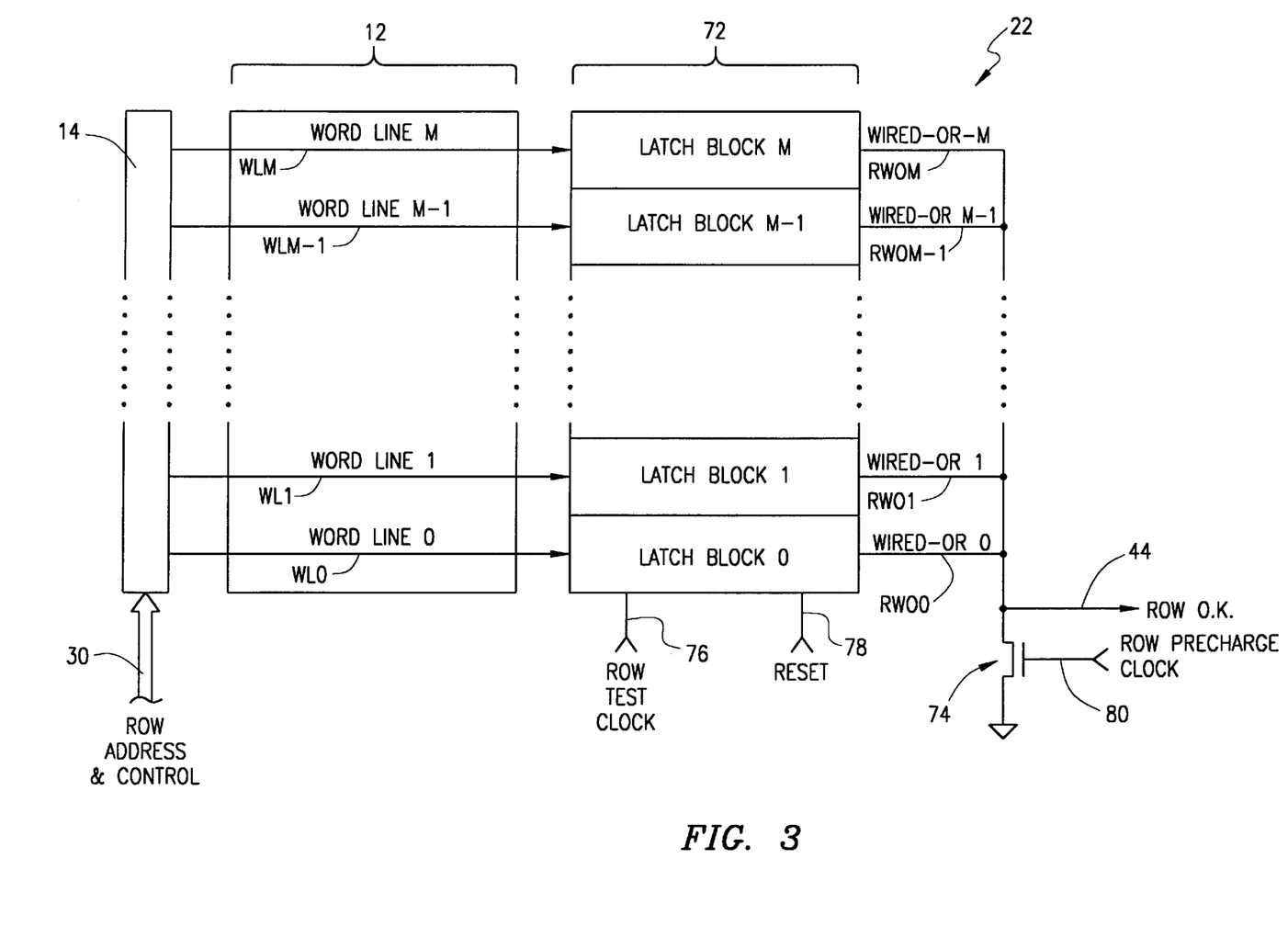
FIG. 3 is a detailed schematic diagram of the row test circuitry shown in FIG. 1.

When in the test mode, the BIST controller 20 controls the operation of two distinct test routines: a row test routine and a column test routine. The row test routine is performed utilizing the row test circuitry 22, while the column test routine is performed utilizing the column test circuitry 24 and the test ROM 26. Referring to FIG. 3, there is shown a more detailed schematic diagram of the row test circuitry 22, along with the DRAM memory array 12 and the row address decoder 14. As shown, the row test circuitry 22 includes a plurality of latch block circuits 72, each having a wired-or output line (RWO) connected to the drain of a row precharge transistor 74. Each of the plurality of latch block circuits 72 has as an input thereto a corresponding one of the plurality of wordlines of the DRAM memory array 12. Each of the plurality of latch block circuits 72 also has a row test clock signal line 76 and a reset signal line 78 as inputs. A row precharge clock signal line 80 is connected to the gate of the row precharge transistor 74 for controlling the conductive state of the row precharge transistor 74, as described in detail below.

When performing the row test routine, the BIST controller 20 generates row address and control signals and provides them to the row address decoder 14 via the row address and control lines 30. The row address and control signals typically include address bit signals for addressing a predetermined number of memory cells 52 in the DRAM memory array 12 (e.g., a predetermined number of memory cells 52 which corresponds to the number of bits that make up a data word in the DRAM memory array 12), and a row address strobe signal for latching the address bit signals in the row address decoder 14. After the address bit signals are latched, the row address decoder 14 decodes the address bit signals so as to activate one of the plurality of wordlines in the DRAM memory array 12. When activated, the wordline is driven to a logic "1" so as to allow access to the predetermined number of memory cells 52 through access transistors 56 in the DRAM memory array 12 (see FIG. 2). The activated wordline is also applied to a corresponding one of the plurality of latch block circuits 72.

Figure 4:
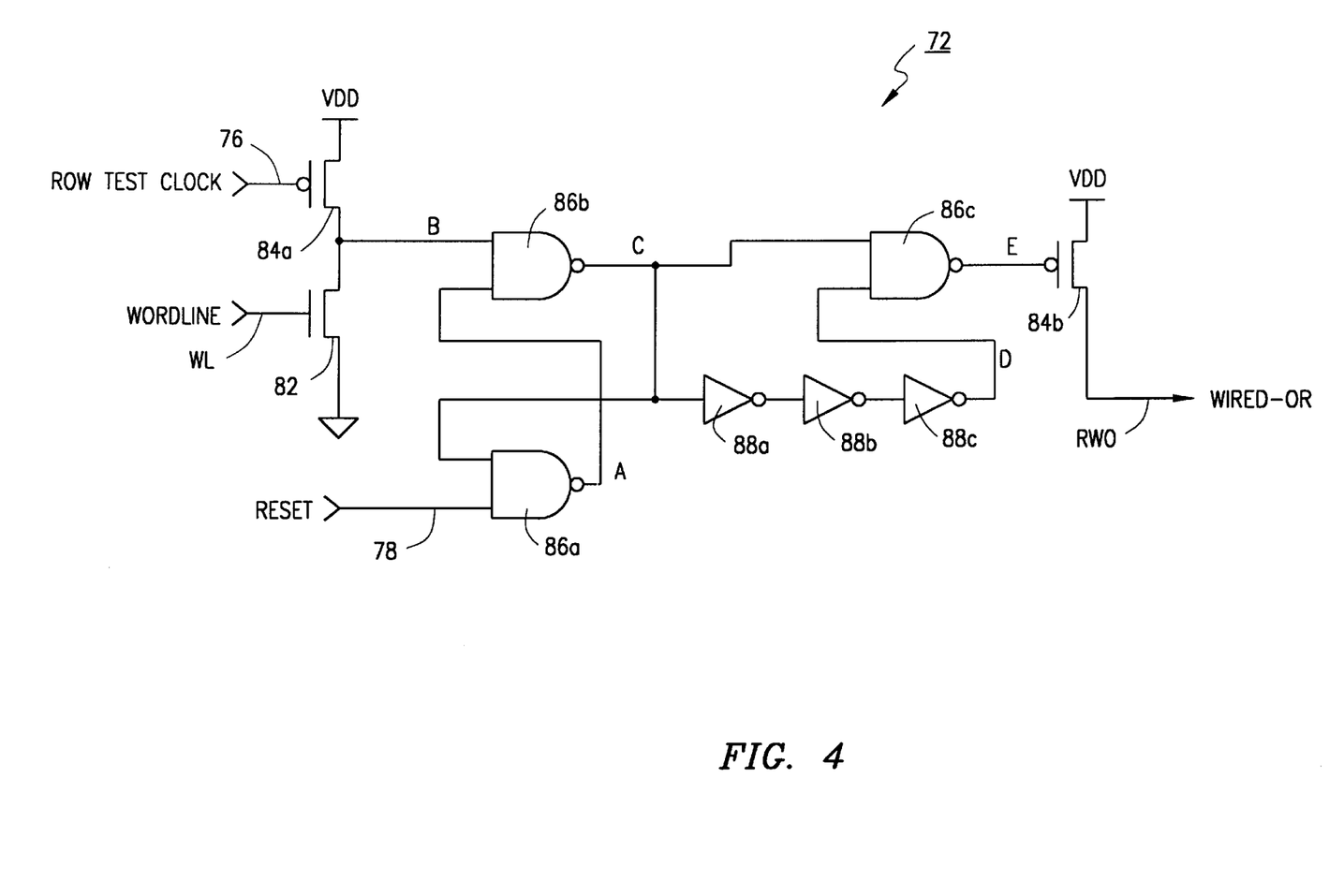
FIG. 4 is a detailed schematic diagram of a latch block circuit in accordance with the present invention.
Figure 5:
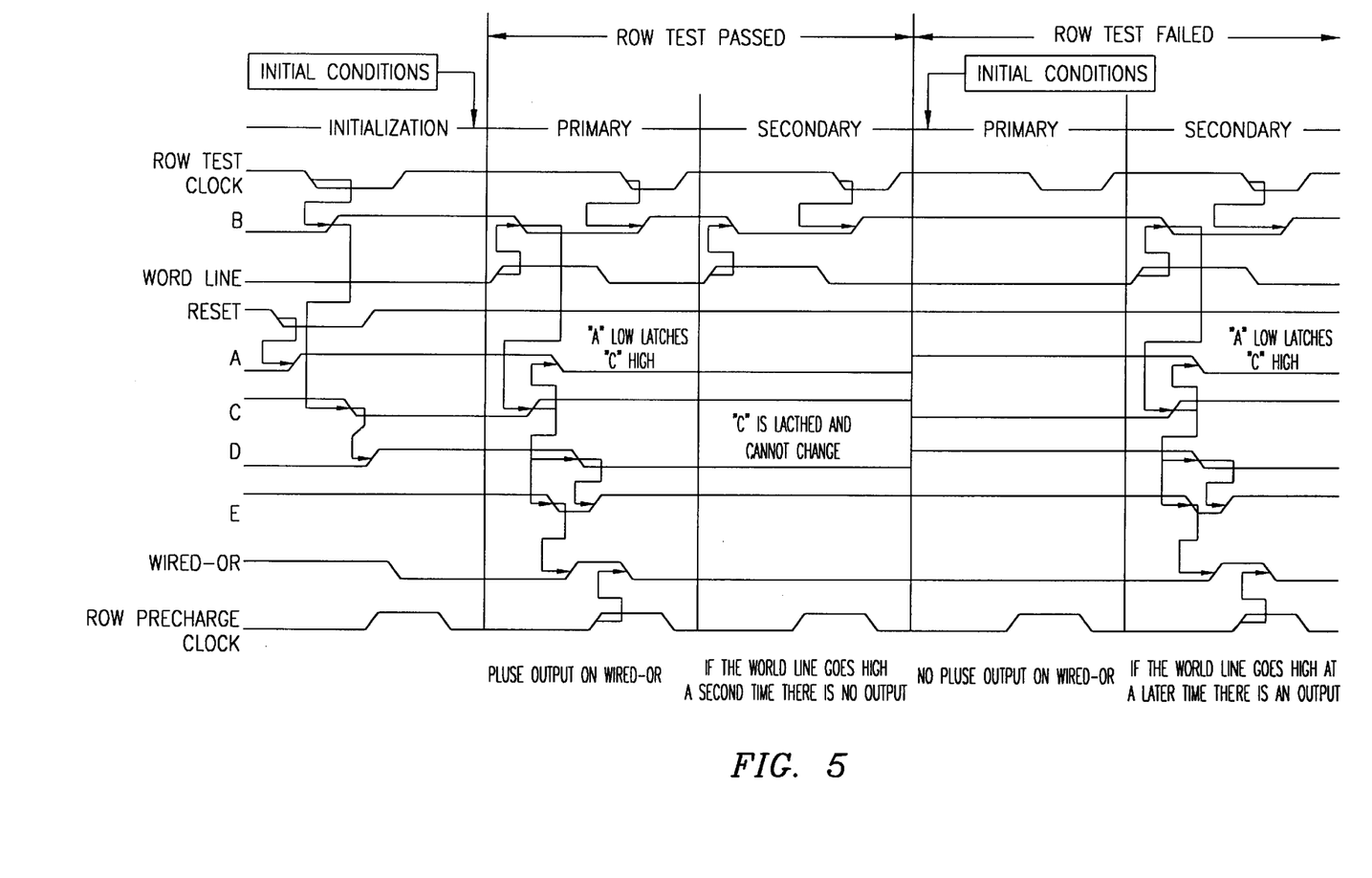
FIG. 5 is a timing diagram detailing the operation of the latch block circuit shown in FIG. 4.

Referring to FIG. 4, there is shown a schematic diagram of one of the plurality of latch block circuits 72. As shown, each latch block circuit 72 includes an N-channel transistor 82, a pair of P-channel transistors 84, a plurality of NAND gates 86, and a plurality of inverters 88. Referring to FIG. 5, there is shown a timing diagram detailing the operation of the latch block circuit 72 shown in FIG. 4. At the start of the row test routine, the BIST controller 20 generates an active low reset signal that is carried by the reset signal line 78 to each latch block circuit 72 for resetting each latch block circuit 72 during an initialization cycle. After the initialization cycle, the BIST controller 20 generates a first set of row address and control signals so as to activate a first one of the plurality of wordlines in the DRAM memory array 12 at the start of a first primary test cycle. If the wordline WL is activated such that a logic "1" is present on the wordline WL input of the latch block circuit 72, the N-channel transistor 82 will begin to conduct and an active high pulse will be generated on the wired-or output line RWO (see primary test cycle of row test passed sequence in FIG. 5). This active high pulse will be carried over the row o.k. signal line 44 to the BIST controller 20, which will detect the active high pulse and assume that the row address and control lines 30, the row address decoder 14, and the DRAM memory array 12 are operating in the proper manner for that particular set of row address and control signals. The BIST controller 20 will then remove that particular set of row address and control signals from the row address and control lines 30 (e.g., and generate a next set of row address and control signals so as to activate a next one of the plurality of wordlines in the DRAM memory array 12 at the start of a next primary test cycle), thereby causing the activated wordline WL to become deactivated. The BIST controller 20 will then cause an active high pulse to occur on the row precharge clock signal line 80 and an active low pulse to occur on the row test clock signal line 76 so as to reset the wired-or output line RWO and the input to NAND gate 86b, respectively. At this point it should be noted that if for some reason (e.g., a failure in the row address and control lines 30, the row address decoder 14, or the DRAM memory array 12) the same wordline WL becomes activated again during the current row test routine (i.e., before the occurrence of another initialization cycle), the latch block circuit 72 is prevented from generating another active high pulse on the wired-or output line RWO (see secondary test cycle of row test passed sequence in FIG. 5).

If, after the BIST controller 20 generates the first set of row address and control signals, the wordline WL does not become activated such that a logic "1" is not present on the wordline WL input of the latch block circuit 72, the N-channel transistor 82 will remain in a non-conducting state and no pulse will be generated on the wired-or output line RWO (see primary test cycle of row test failed sequence in FIG. 5). The BIST controller 20 will detect the absence of an active high pulse on the wired-or output line RWO and assume that a failure has occurred in the row address and control lines 30, the row address decoder 14, or the DRAM memory array 12 for that particular set of row address and control signals. At this point the BIST controller 20 may stop the row test routine, or, similar to the row test passed sequence described above, the BIST controller 20 may remove the first set of row address and control signals from the row address and control lines 30 and generate a next set of row address and control signals so as to activate a next one of the plurality of wordlines in the DRAM memory array 12 at the start of a next primary test cycle. The BIST controller 20 will always cause an active high pulse to occur on the row precharge clock signal line 80 and an active low pulse to occur on the row test clock signal line 76 for resetting the wired-or output line and the input to NAND gate 86*b*, respectively, at the end of each test cycle (primary or secondary). At this point it should be noted that if for some reason (e.g., a successful test using the first set of row address and control signals) the same wordline WL becomes activated during the current row test routine (i.e., before the occurrence of another initialization cycle), the latch block circuit 72 will generate an active high pulse on the wired-or output line RWO (see secondary test cycle of row test failed sequence in FIG. 5). Similar to the primary test cycle of the row test passed sequence, this active high pulse will be carried over the row o.k. signal line 44 to the BIST controller 20, which will detect the active high pulse and assume that the row address and control lines 30, the row address decoder 14, and the DRAM memory array 12 may now be operating in the proper manner for that particular set of row address and control signals. Of course, similar to the secondary test cycle of the row test passed sequence described above, if for some reason (e.g., a failure in the row address and control lines 30, the row address decoder 14, or the DRAM memory array 12) the same wordline WL becomes activated again during the current row test routine (i.e., before the occurrence of another initialization cycle), the latch block circuit 72 is prevented from generating another active high pulse on the wired-or output line RWO (see secondary test cycle of row test passed sequence in FIG. 5).

The row test routine is typically performed for every valid row address of the DRAM memory array 12, unless, as previously noted, the BIST controller 20 stops the row test routine after determining that a failure has occurred.

At this point it should be noted that the BIST controller 20 could alternatively perform the row test routine by cycling through every valid row address of the DRAM memory array 12 and counting the number of active high pulses which occur on the row o.k. signal line 44. The number of active high pulses detected could then be compared to the number of valid row addresses so as to determine if a failure has occurred.

Figure 6:
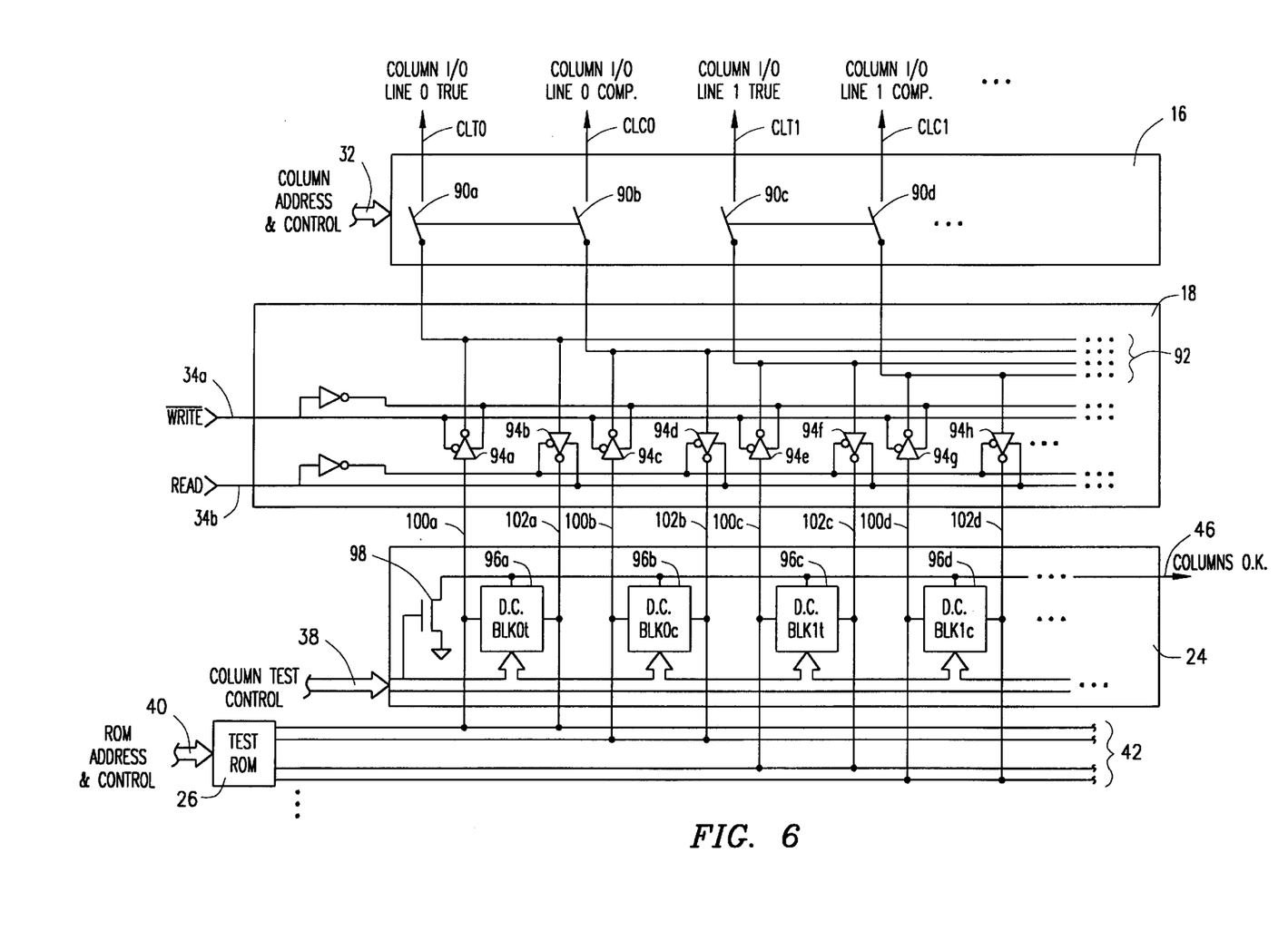
FIG. 6 is a detailed schematic diagram of the column test circuitry, the read/write circuitry, and the column address decoder shown in FIG. 1.

Referring to FIG. 6, there is shown a more detailed schematic diagram of the column address decoder 16, the R/W circuitry 18, and the column test circuitry 24. As shown, the column address decoder 16 includes a plurality of switch pairs 90 for connecting the true and complement column I/O lines of the DRAM memory array 12 to the R/W circuitry 18. The switch pairs 90 are controlled by decoded column address and control signals, as described in detail below.

The R/W circuitry 18 includes a local bus 92 for carrying data signals to and from connected ones of the true and complement column I/O lines (i.e., those connected through the switch pairs 90 of the column address decoder 16). The R/W circuitry 18 also includes a plurality of tristate inverters 94 for transmitting write data signals and read data signals to and from connected ones of the true and complement column I/O lines, respectively. The number of tristate inverters 94, as well as the size of the local bus 92, is typically related to the input/output (I/O) format of the DRAM memory array 12 (i.e., the number of bits in a data word of the DRAM memory array 12). The tristate inverters 94 are controlled by R/W control signals that are carried from the BIST controller 20 by the R/W control lines 34, which in this particular embodiment include a write control line 34*a* and a read control line 34*b*.

The column test circuitry 24 includes a plurality of data compare block circuits 96 for comparing write data signals carried over write data signal lines 100 to read data signals carried over read data signal lines 102. The write data signals originate from the test ROM 26 and are carried over the system data bus 42 and the write data signal lines 100 to the data compare block circuits 96. The write data signals are then transmitted by tristate inverters 94 to the DRAM memory array 12 over the local bus 92 and connected ones of the true and complement column I/O lines. The read data signals originate from the DRAM memory array 12 and are carried over connected ones of the true and complement column I/O lines to the local bus 92. The read data signals are then transmitted by tristate inverters 94 to the data compare block circuits 96 over the read data signal lines 102. Similar to the tristate inverters 94, the number of data compare block circuits 96, as well as the number of write data signal lines 100 and read data signal lines 102, is typically related to the I/O format of the DRAM memory array 12 (i.e., the number of bits in a data word of the DRAM memory array 12).

The column test circuitry 24 also includes a column precharge transistor 98 for controlling the state of the columns o.k. signal on the columns o.k. signal line 46, as described in detail below. Both the data compare block circuits 96 and the column precharge transistor 98 are controlled by the column test control lines 38, as also described in detail below. The test ROM 26 is controlled by the ROM address and control lines 40, as further described in detail below. At this point it should be noted that although the system data bus 42 is shown as being a differential data bus for carrying differential data signals (i.e., true and complement data signals), the system data bus 42 could alternatively be a single-ended data bus for carrying single-ended data signals. Of course, if the array being tested includes complementary data lines, such as with the DRAM memory array 12 described herein, single-ended data signals carried over a single-ended data bus would at some point need to be converted into differential data signals.

Figure 7:
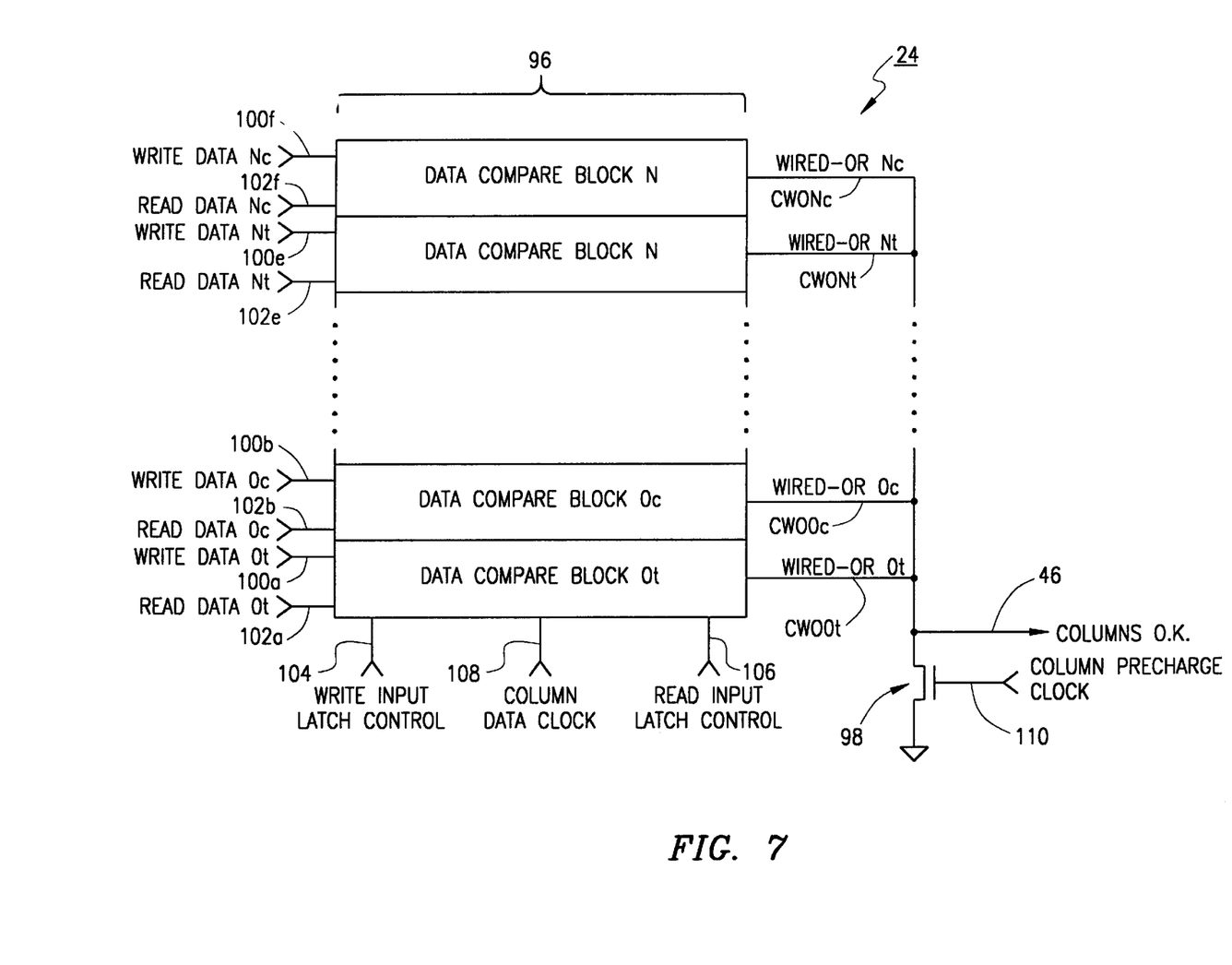
FIG. 7 is a more detailed schematic diagram of the column test circuitry shown in FIG. 6.

Referring to FIG. 7, there is shown a more detailed schematic diagram of the column test circuitry 24. As shown, the column test circuitry 24 includes the plurality of data compare block circuits 96, each having a wired-or output line (CWO) connected to the drain of the column precharge transistor 98. Each of the plurality of data compare block circuits 96 has as an input thereto a corresponding write data signal line 100 and a corresponding read data signal line 102. Each of the plurality of data compare block circuits 96 also has a write input latch control signal line 104, a read input latch control signal line 106, and a column data clock signal line 108 as inputs. A column precharge clock signal line 110 is connected to the gate of the column precharge transistor 98 for controlling the conductive state of the column precharge transistor 98, as described in detail below.

When performing the column test routine, the BIST controller 20 generates row address and control signals and provides them to the row address decoder 14 via the row address and control lines 30. As previously described, the row address and control signals typically include address bit signals for addressing a predetermined number of memory cells 52 in the DRAM memory array 12 (e.g., a predetermined number of memory cells 52 which corresponds to the number of bits that make up a data word in the DRAM memory array 12), and a row address strobe signal for latching the address bit signals in the row address decoder 14. After the address bit signals are latched, the row address decoder 14 decodes the address bit signals so as to activate one of the plurality of wordlines in the DRAM memory array 12. When activated, the wordline is driven to a logic "1" so as to allow access to the predetermined number of memory cells 52 through access transistors 56 in the DRAM memory array 12 (see FIG. 2).

The BIST controller 20 also generates column address and control signals when performing the column test routine and provides them to the column address decoder 16 via the column address and control lines 32. The column address and control signals typically include address bit signals for addressing a predetermined number of switch pairs 90 (i.e., a predetermined number of switch pairs 90 which corresponds to the number of bits that make up a data word in the DRAM memory array 12), and a column address strobe signal for latching the address bit signals in the column address decoder 16. After the address bit signals are latched, the column address decoder 16 decodes the address bit signals so as to activate (i.e., close) the predetermined number of switch pairs 90, thereby connecting a corresponding predetermined number of true and complement column I/O line pairs of the DRAM memory array 12 to the local bus 92 through the column address decoder 16. The true and complement column I/O line pairs that are connected to the local bus 92 allow access to the predetermined number of memory cells 52 in the DRAM memory array 12 which were addressed using the row address and control signals.

The BIST controller 20 further generates ROM address and control signals when performing the column test routine and provides them to the test ROM 26 via the ROM address and control lines 40. The ROM address and control signals typically include address bit signals for addressing a write data word in the test ROM 26, and an output enable signal for outputting the write data word onto the system data bus 42. The write data word that is output onto the system data bus 42 is represented by the write data signals that are carried over the system data bus 42 and the write data signal lines 100 to the data compare block circuits 96, as previously described. The write data signals are latched in corresponding data compare block circuits 96. The write data signals are also transmitted by tristate inverters 94 over the local bus 92 and the connected true and complement column I/O line pairs to the DRAM memory array 12 for storage within the predetermined number of memory cells 52 which were addressed using the row address and control signals.

After the write data signals are stored within the predetermined number of memory cells 52, read data signals are generated from the write data signals which were stored within the predetermined number of memory cells 52. That is, the write data signals which were stored within the predetermined number of memory cells 52 are read from the predetermined number of memory cells 52, thereby generating a corresponding number of read data signals. The read data signals are carried over the connected true and complement column I/O line pairs and the local bus 92 to tristate inverters 94, which then transmit the read data signals over the read data signal lines 102 to corresponding data compare block circuits 96. The data compare block circuits 96 latch the corresponding read data signals, and then compare the previously latched write data signals with the more recently latched read data signals so as to determine if the column address and control lines 32, the column address decoder 16, the R/W control lines 34, the R/W circuitry 18, the system data bus 42, and the DRAM memory array 12 are operating in the proper manner for the particular set of row address and control signals, column address and control signals, and R/W control signals being applied to the row address decoder 14, the column address decoder 16, and R/W circuitry 18, respectively. If the previously latched write data signals match the more recently latched read data signals in all of the data compare block circuits 96, then the BIST controller 20 will assume that the column address and control lines 32, the column address decoder 16, the R/W control lines 34, the R/W circuitry 18, the system data bus 42, and the DRAM memory array 12 are operating in the proper manner, as described in detail below. However, if the previously latched write data signals do not match the more recently latched read data signals in any of the data compare block circuits 96, then the PIST controller 20 will assume that a failure has occurred in the column address and control lines 32, the column address decoder 16, the R/W control lines 34, the R/W circuitry 18, the system data bus 42, or the DRAM memory array 12, as also described in detail below.

Figure 8:
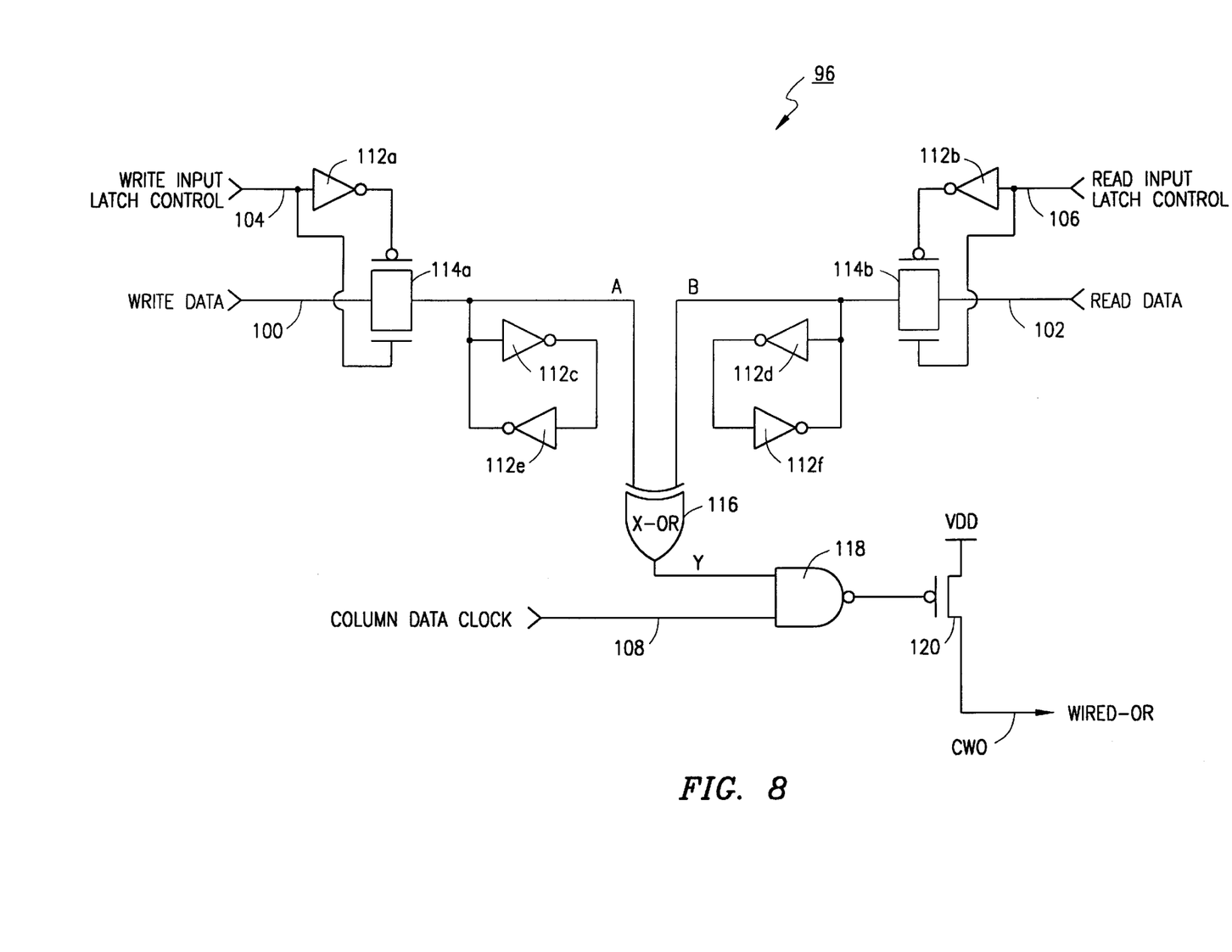
FIG. 8 is a detailed schematic diagram of a data compare block circuit in accordance with the present invention.
Figure 9:
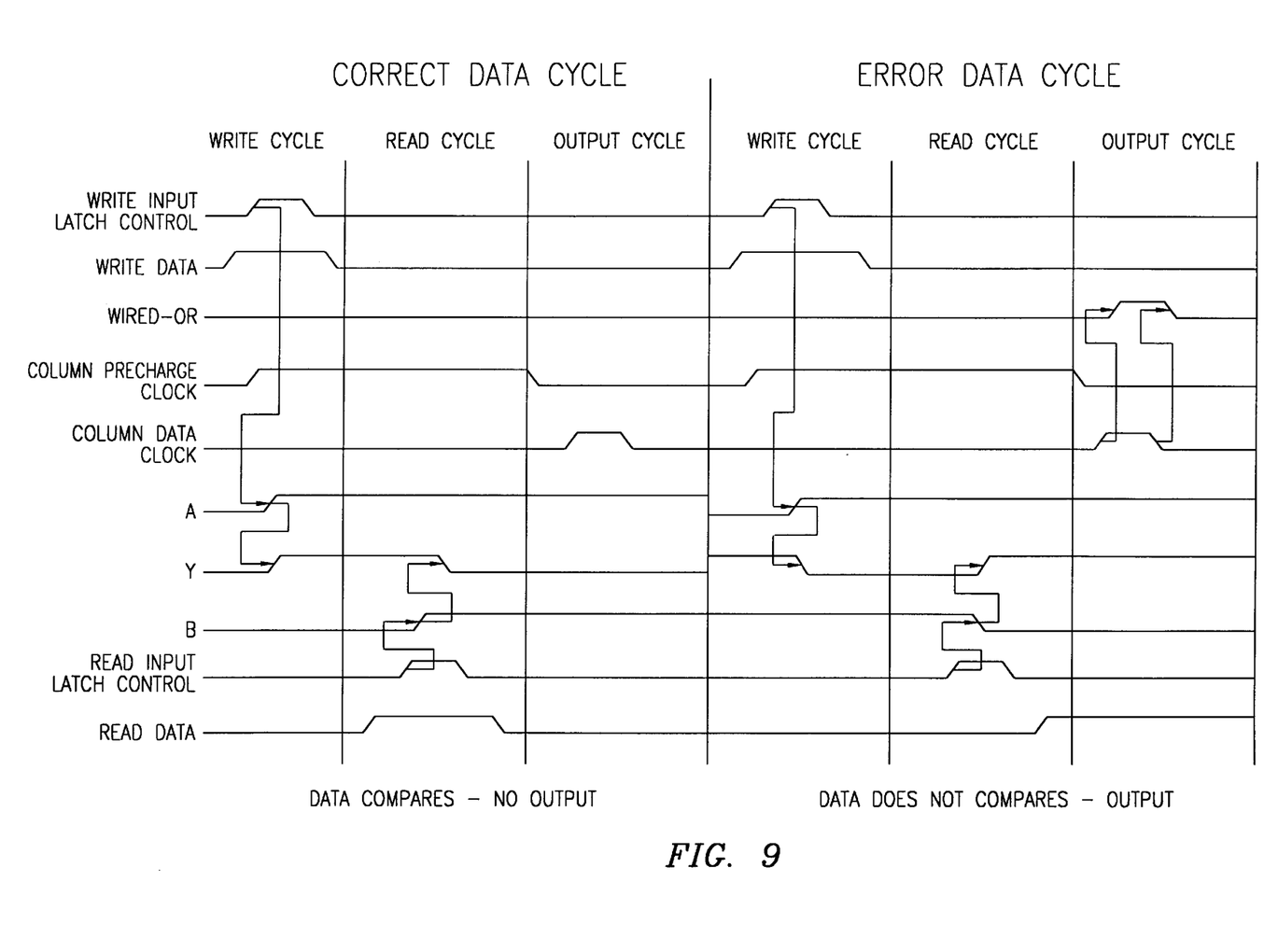
FIG. 9 is a timing diagram detailing the operation of the data compare block circuit shown in FIG. 8.

Referring to FIG. 8, there is shown a schematic diagram of one of the plurality of data compare block circuits 96. As shown, each data compare block circuit 96 includes a plurality of inverters 112, a pair of transmission gates 114, an exclusive-OR gate 116, a NAND gate 118, and a P-channel transistor 120. It should be noted that inverters 112e and 112f are weak inverters so that signals on signal lines A and B are latched when not being actively driven by transmission gates 114a and 114b, respectively. Referring to FIG. 9, there is shown a timing diagram detailing the operation of the data compare block circuit 96 shown in FIG. 8.

During the column test routine, the BIST controller 20 first causes the column precharge clock signal line 110 to transition to a logic "1" state so as to clear all of the wired-or output lines and the columns o.k. signal line 46 (see FIG. 7). The BIST controller 20 then causes an active high pulse to occur on the write input latch control line 104 so that the write data signals on the write data signal lines 100 can become latched in each data compare block circuit 96 (see write cycles in FIG. 9). The BIST controller 20 then causes an active high pulse to occur on the read input latch control line 106 so that the read data signals on the read data signal lines 102 can also become latched in each data compare block circuit 96 (see read cycles in FIG. 9). If the latched write data matches the latched read data in each data compare block circuit 96, then the P-channel transistor 120 in each data compare block circuit 96 will remain in a non-conducting state after the BIST controller 20 causes an active high pulse to occur on the column data clock line 108, and the wired-or output line (CWO) from each data compare block circuit 96 will not be pulled-up after the BIST controller 20 causes the column precharge clock signal line 110 to transition to a logic "0" state (see output cycle of the correct data cycle in FIG. 9). Thus, the columns o.k. signal line 46 to the BIST controller 20 will also not be pulled-up (i.e., will remain at a logic "0" level), and the BIST controller 20 will assume that the column address and control lines 32, the column address decoder 16, the R/W control lines 34, the R/W circuitry 18, the system data bus 42, and the DRAM memory array 12 are operating in the proper manner for the particular set of row address and control signals, column address and control signals, and R/W control signals being applied to the row address decoder 14, the column address decoder 16, and R/W circuitry 18, respectively. The BIST controller 20 will then generate a next set of row address and control signals, column address and control signals, and R/W control signals so as to further test the column address and control lines 32, the column address decoder 16, the R/W control lines 34, the R/W circuitry 18, the system data bus 42, and the DRAM memory array 12.

If the latched write data does not match the latched read data in any of the data compare block circuits 96, then the P-channel transistor 120 in that particular data compare block circuit 96 will begin to conduct after the BIST controller 20 causes an active high pulse to occur on the column data clock line 108, and the wired-or output line (CWO) from that particular data compare block circuit 96 will be pulled-up after the BIST controller 20 causes the column precharge clock signal line 110 to transition to a logic "0" state (see output cycle of the error data cycle in FIG. 9). Thus, the columns o.k. signal line 46 to the BIST controller 20 will also be pulled-up (i.e., will transition to a logic "1" level), and the BIST controller 20 will assume that a failure has occurred in the column address and control lines 32, the column address decoder 16, the R/W control lines 34, the R/W circuitry 18, the system data bus 42, or the DRAM memory array 12 for the particular set of row address and control signals, column address and control signals, and R/W control signals being applied to the row address decoder 14, the column address decoder 16, and R/W circuitry 18, respectively. At this point the BIST controller 20 may stop the column test routine, or generate a next set of row address and control signals, column address and control signals, and R/W control signals so as to further test the column address and control lines 32, the column address decoder 16, the R/W control lines 34, the R/W circuitry 18, the system data bus 42, and the DRAM memory array 12.

The column test routine is typically performed for every valid column address of the DRAM memory array 12, unless, as previously noted, the BIST controller 20 stops the column test routine after determining that a failure has occurred.

At this point it should be noted that the test ROM 26 is not limited to an actual ROM device, and could instead be realized as any circuitry for providing patterns of write data signals that can be latched in data compare block circuits 96 and stored within memory cells 52 of the DRAM memory array 12. Of course, the state of these write data signals should not remain constant. That is, each of the write data signals should be capable of assuming both a logic "0" state and a logic "1" state so as to allow either a logic "0" value or a logic "1" value to be latched in data compare block circuits 96 and stored within memory cells 52 of the DRAM memory array 12 so that the column address and control lines 32, the column address decoder 16, the R/W control lines 34, the R/W circuitry 18, the system data bus 42, and the DRAM memory array 12 can be tested in a thorough manner.

It should also be noted that the use of the test ROM 26 allows the BIST controller 20 to be more generic and thereby allow the BIST controller 20 to possibly perform a greater number of more generic functions, such as controlling the testing of several DRAM memory arrays and related circuitry rather than just a single DRAM memory array and related circuitry. For example, several DRAM memory arrays and related circuitry could each have their own test ROM for providing write data signals, and the BIST controller 20 could control the test ROM for each DRAM memory array and related circuitry in the same manner as described above. In such a case, the BIST controller 20 is alleviated from storing write data signals within the BIST controller 20 for each DRAM memory array and related circuitry, and also from providing these write data signals directly from the BIST controller 20 to each DRAM memory array and related circuitry.

It should further be noted that the present invention is not limited to the testing of DRAM memory arrays. For example, other memory types, such as static RAMs and ROMs, may be tested using the testing concepts disclosed herein. Likewise, other types of DRAMs than the one described herein may also use the testing concepts disclosed herein. Such other types of DRAMs may differ in, for example, address field, data bus width, and overall memory architecture.

The present invention is not to be limited in scope by the specific embodiments described herein. Indeed, various modifications of the present invention, in addition to those described herein, will be apparent to those of skill in the art from the foregoing description and accompanying drawings. Thus, such modifications are intended to fall within the scope of the appended claims.

What is claimed is:

1. A method for testing wordline and related circuitry of a memory array, the memory array including a plurality of memory cells arranged in a plurality of rows, each of the plurality of rows having a respective wordline connected to respective ones of the plurality of memory cells, the related circuitry including a decode circuit connected to a first end of each of the respective wordlines for activating at least one of the respective wordlines based upon a corresponding address signal that is decoded by the decode circuit, the method comprising the steps of:

applying an address signal to the decode circuit so as to activate a corresponding one of the respective wordlines; and monitoring a second end of the corresponding one of the respective wordlines so as to determine if the corresponding one of the respective wordlines has been activated and thereby determine if the entire length of the corresponding one of the respective wordlines and the related circuitry are operating in a proper manner.

2. The method as defined in claim 1, further comprising the step of:

detecting if the corresponding one of the respective wordlines has been activated.

3. The method as defined in claim 2, further comprising the step of:

deactivating the corresponding one of the respective wordlines after detecting that the corresponding one of the respective wordlines has been activated.

4. The method as defined in claim 3, further comprising the step of:

preventing the detection of a subsequent activation of the corresponding one of the respective wordlines after it has been deactivated.

5. The method as defined in claim 1, wherein the step of applying an address signal to the decode circuit includes:

applying a sequence of address signals to the decode circuit so as to activate a corresponding sequence of the respective wordlines.

6. The method as defined in claim 5, wherein the step of monitoring a second end of the corresponding one of the respective wordlines includes:

monitoring a second end of each respective wordline in the corresponding sequence of the respective wordlines so as to determine if each respective wordline in the corresponding sequence of the respective wordlines has been activated and thereby determine if the entire length of each respective wordline in the corresponding sequence of the respective wordlines and the related circuitry are operating in a proper manner.

7. The method as defined in claim 6, wherein the step of monitoring a second end of the corresponding one of the respective wordlines further includes:

detecting if each respective wordline in the corresponding sequence of the respective wordlines has been activated.

8. The method as defined in claim 7, further comprising the step of:

deactivating each respective wordline in the corresponding sequence of the respective wordlines after detecting that each respective wordline in the corresponding sequence of the respective wordlines has been activated.

9. The method as defined in claim 8, further comprising the step of:

preventing the detection of a subsequent activation of any of the respective wordlines in the corresponding sequence of the respective wordlines after they are deactivated.

10. An apparatus for testing wordline and related circuitry of a memory array, the memory array including a plurality of memory cells arranged in a plurality of rows, each of the plurality of rows having a respective wordline connected to respective ones of the plurality of memory cells, the related circuitry including a decode circuit connected to a first end of each of the respective wordlines for activating at least one of the respective wordlines based upon a corresponding address signal that is decoded by the decode circuit, the apparatus comprising;

a controller for applying an address signal to the decode circuit so as to activate a corresponding one of the respective wordlines; and a test circuit for monitoring a second end of the corresponding one of the respective wordlines so as to determine if the corresponding one of the respective wordlines has been activated and thereby determine if the entire length of the corresponding one of the respective wordlines and the related circuitry are operating in a proper manner.

11. The apparatus as defined in claim 10, wherein the test circuit includes:

a detector circuit for detecting if the corresponding one of the respective wordlines has been activated.

12. The apparatus as defined in claim 11, wherein the test circuit further includes:

a deactivator circuit for deactivating the corresponding one of the respective wordlines after detecting that the corresponding one of the respective wordlines has been activated.

13. The apparatus as defined in claim 12, wherein the test circuit further includes:

a latch circuit for preventing the detection of a subsequent activation of the corresponding one of the respective wordlines after it has been deactivated.

14. The apparatus as defined in claim 10, wherein the controller applies a sequence of address signals to the decode circuit so as to activate a corresponding sequence of the respective wordlines.

15. The apparatus as defined in claim 14, wherein the test circuit monitors a second end of each respective wordline in the corresponding sequence of the respective wordlines so as to determine if each respective wordline in the corresponding sequence of the respective wordlines has been activated and thereby determine if the entire length of each respective wordline in the corresponding sequence of the respective wordlines and the related circuitry are operating in a proper manner.

16. The apparatus as defined in claim 15, wherein the test circuit includes:

a detector circuit for detecting if each respective wordline in the corresponding sequence of the respective wordlines has been activated.

17. The apparatus as defined in claim 16, wherein the test circuit further includes:

a deactivator circuit for deactivating each respective wordline in the corresponding sequence of the respective wordlines after detecting that each respective wordline in the corresponding sequence of the respective wordlines has been activated.

18. The apparatus as defined in claim 17, wherein the test circuit further includes:

a latch circuit for preventing the detection of a subsequent activation of any of the respective wordlines in the corresponding sequence of the respective wordlines after they are deactivated.

* * * * *